United States Patent
Takebayashi (10) Patent No.: US 8,012,259 B2
(45) Date of Patent: Sep. 6, 2011

(54) SUBSTRATE PROCESSING APPARATUS

(75) Inventor: Yuji Takebayashi, Toyama (JP)

(73) Assignee: Hitachi Kokusai Electric, Inc., Tokyo (JP)

( * ) Notice: Subject to any disclaimer, the term of this patent is extended or adjusted under 35 U.S.C. 154(b) by 626 days.

(21) Appl. No.: 12/043,574

(22) Filed: Mar. 6, 2008

(65) Prior Publication Data

US 2008/0216742 A1 Sep. 11, 2008

(30) Foreign Application Priority Data

Mar. 9, 2007 (JP) .................................. 2007-059886

(51) Int. Cl.
*C23C 16/00* (2006.01)
(52) U.S. Cl. ........................................................ 118/715
(58) Field of Classification Search .................... 118/715
See application file for complete search history.

(56) References Cited

U.S. PATENT DOCUMENTS

| 2004/0082171 A1* | 4/2004 | Shin et al. ..................... 438/689 |
| 2005/0011453 A1* | 1/2005 | Okumura et al. ......... 118/723 E |

FOREIGN PATENT DOCUMENTS

| JP | 11-102903 | 4/1999 |
| JP | 2000-182979 | 6/2000 |

* cited by examiner

*Primary Examiner* — Keath T Chen
(74) *Attorney, Agent, or Firm* — Brundidge & Stanger, P.C.

(57) ABSTRACT

A substrate processing apparatus having a support for holding a wafer, a processing chamber for accommodating the wafer, a gas supply hole for supplying desired processing gas in a parallel direction to the surface to be processed of the wafer to be accommodated in said processing chamber, an adjustment plate to be arranged with facing the surface to be processed of the wafer accommodated in the foregoing processing chamber, and an exhaust means for exhausting atmosphere in said processing chamber. A substrate processing apparatus wherein distance between the surface to be processed of wafer and the center part of the adjustment plate is narrower than distance between the surface to be processed of wafer and the circumference part and the midway part of the adjustment plate, in a direction perpendicular to a supply direction of processing gas.

4 Claims, 8 Drawing Sheets

SUBSTRATE PROCESSING APPARATUS

INCORPORATION BY REFERENCE

The present application claims priority from Japanese application JP2007-059886 filed on Mar. 9, 2007, the content of which is hereby incorporated by reference into this application.

BACKGROUND OF THE INVENTION

The present invention relates to a substrate processing apparatus, in particular, relates to a substrate processing apparatus for forming a film on a substrate surface to be processed.

As one example of this type of a substrate processing apparatus, there has been known an apparatus for forming a film on a surface to be processed, by accommodating a substrate in a processing chamber, and rotating the substrate thereof, and by supplying the desired processing gas toward the substrate surface to be processed. In the said apparatus, there is installed a gas supply unit for supplying desired processing gas in a direction parallel to the substrate surface to be processed, and the processing gas is designed to be supplied from the gas supply unit toward the substrate surface to be processed.

It should be noted that, as prior documents thereof, JP-A-2000-182979, and JP-A-11-102903 are included.

In this case, there were such cases, in some times, that film thickness decreased at the center part of the substrate, and thickness of a film formed on the substrate surface to be processed did not become uniform over the whole surface to be processed. That is, in a substrate processing apparatus such as a CVD (chemical vapor deposition) apparatus, it is configured so that processing gas is flowed horizontally to a wafer, however, in a processing chamber of a normal-flow system, where an exhaust port is arranged at the lower end part, because of arrangement of a gas nozzle at the inside of a process tube, a space between the wafer and the process tube becomes wider to a wafer pitch, resulting in flow-out of most of the processing gas through the space between the wafer and the process tube, which raised a problem that a supply of processing gas toward the wafer center was insufficient, in particular, at the top side (upper end side) of a boat and provided such film thickness distribution in a surface as thicker at the circumference part and thinner at the center part.

Figure 4:
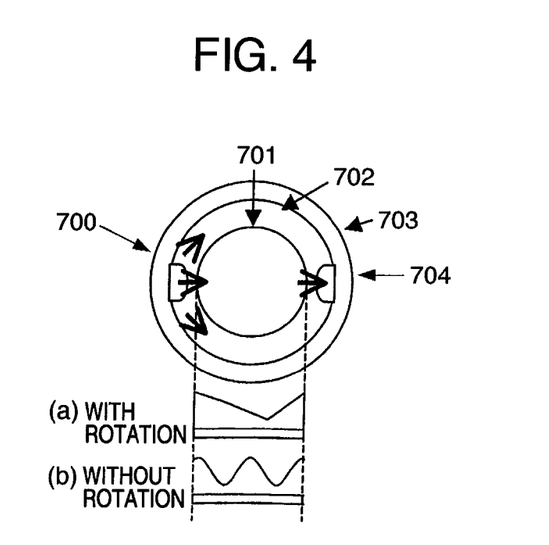
FIG. 4 is a drawing of a film thickness distribution image in side-flow.
Figure 5:
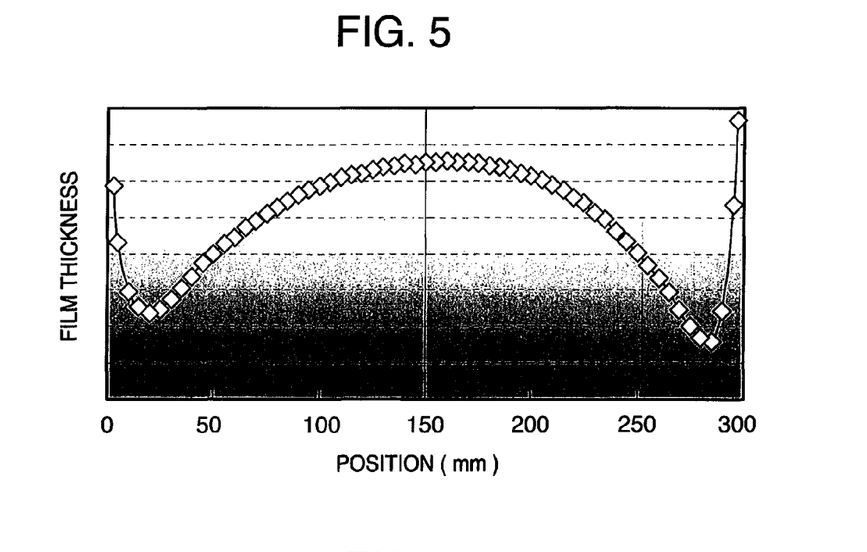
FIG. 5 is a drawing of an actual measurement data of film thickness in side-flow.

In addition, in a processing chamber of a side-flow system, such as described in patent application 2007-165388, having a gas nozzle provided with a plurality of gas supply holes extending in a lamination direction of a substrate, which is a gas supply unit installed in a processing chamber, and a plurality of gas exhaust holes installed at a position facing this gas nozzle, as shown schematically in FIG. 4, a gas supply port 700 and an exhaust port 704 are arranged in facing positions in each wafer 701. Therefore, in the case where gas is supplied without rotation of the wafer 701, as shown in FIG. 4($a$), film thickness becomes thinnest at a position a little displaced toward the exhaust port 704 side from the center of the wafer 701; on the other hand, in the case where the wafer is rotated, as shown in FIG. 4($b$), a W-character-type film thickness distribution is obtained, therefore, to enhance uniformity, it is necessary to promote a gas consumption not only at the end of the wafer 701 but also at the center part thereof. Here, in FIG. 5, experimental data of film thickness distribution was shown, in the case where gas is supplied by rotation of the wafer 701, under film-formation condition of a temperature of 220° C. and a phase flow amount of 15 slm, in a processing chamber of a side-flow system.

Accordingly, it is a main object of the present invention to provide a substrate processing apparatus that is capable of making uniform thickness of a film formed on a substrate surface to be processed.

SUMMARY OF THE INVENTION

To solve the above problems, the present inventors have intensively studied on causes of the problems and found the tendency that, in a configuration that a processing gas is simply supplied from a gas supply unit, flow rate or concentration or the like of the processing gas is attenuated toward the center part of a substrate, and a supply amount of the processing gas arriving at a substrate surface to be processed becomes different between at the center part and a part other than the center part, that is, the supply amount of the processing gas decreases at the center part, while the supply amount of the processing gas increases at a part other than the center part such as the side peripheral part.

Therefore, according to one embodiment of the present invention, there is provided a substrate processing apparatus having:

a substrate hold means for holding a substrate, a processing chamber for accommodating the substrate and the substrate hold means, a supply means for supplying desired processing gas in a parallel direction to the surface to be processed of the substrate to be accommodated in the processing chamber, a member to be arranged with facing the surface to be processed of the substrate to be accommodated in the processing chamber, and an exhaust means for exhausting atmosphere in the processing chamber, wherein a distance between the surface to be processed of the substrate to be accommodated in the processing chamber, and the center part of the member is narrower than a distance between the surface to be processed of the substrate to be accommodated in the processing chamber, and a part other than the center part of the member, in a direction perpendicular to a supplying direction of the processing gas.

According to one embodiment of the present invention, because, in a direction perpendicular to a supply direction of processing gas, distance between the center part of the member, is narrower than distance between a site other than the center part of the member relative to the surface to be processed of the substrate to be accommodated in the processing chamber, the processing gas supplied from the gas supply unit converges at a position corresponding to the center part of the member, and becomes a condensed state. As a result, it is suppressed that flow rate or concentration or the like of the processing gas attenuates at a position corresponding to the center part of the said member, and variation of supply amount of the processed gas at each position of the center part of the substrate and a site other than the center part becomes small, by which thickness of a film, to be formed on the substrate surface to be processed, can be made uniform over the whole surface to be processed thereof.

Other objects, features and advantages of the invention will become apparent from the following description of the embodiments of the invention taken into conjunction with the accompanying drawings.

DESCRIPTION OF THE EMBODIMENTS

Explanation will be given below on preferable embodiments of the present invention with reference to drawings.

A substrate processing apparatus relevant to the present invention is one configured as an example of a semiconductor manufacturing apparatus used in manufacturing a semiconductor apparatus (IC (Integrated Circuit)).

Explanation will be given below on a case using a vertical-type apparatus for executing heat processing or the like to a substrate, as an example of a substrate processing apparatus.

Embodiment 1

Figure 1:
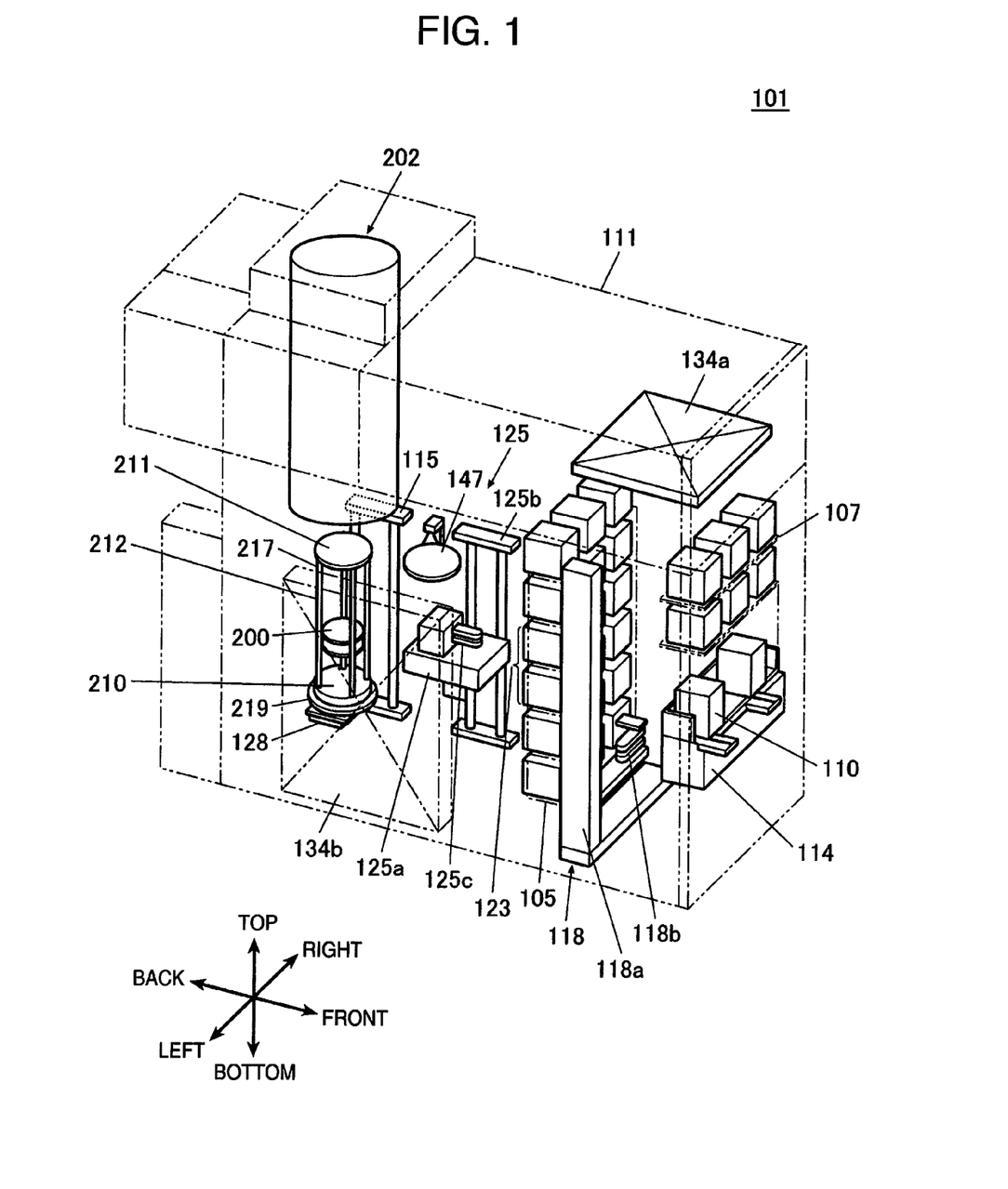
FIG. 1 is an oblique perspective view showing a schematic configuration of a substrate processing apparatus relevant to Embodiment 1 of the present invention.

As shown in FIG. 1, in a substrate processing apparatus 101, a cassette 110 accommodating a wafer 200 of an example of a substrate is used, and the wafer 200 is configured by a material such as silicon. The substrate processing apparatus 101 is provided with a housing 111, and at the inside of the housing 111, a cassette stage 114 is installed. The cassette 110 is designed so as to be carried in onto the cassette stage 114, or carried out from the top of the cassette stage 114, by a yard carrying apparatus (not shown).

The cassette stage 114 is installed so that the wafer 200 in the cassette 110 maintains a vertical position, and a wafer gateway of the cassette 110 faces an upward direction, by the yard carrying apparatus. The cassette stage 114 is configured so as to rotate the cassette 110 clock-wise and in a longitudinal direction by 90 degree to the backward of the housing 111, and so that the wafer 200 in the cassette 110 takes horizontal position, and the wafer gateway of the cassette 110 can move so as to face backward of the housing 111.

At the nearly center part in front and back direction in the housing 111, a cassette shelf 105 is installed, and the cassette shelf 105 is configured so as to store multiple pieces of the cassettes 110, in multiple steps and multiple rows. In the cassette shelf 105, a transfer shelf 123 is installed for accommodating the cassette 110, which is a carrying object of a wafer transfer mechanism 125.

At the upward of the cassette stage 114, a preliminary cassette shelf 107 is installed, which is configured so as to store the cassettes preliminarily.

Between the cassette stage 114 and the cassette shelf 105, a cassette carrying apparatus 118 is installed. The cassette carrying apparatus 118 is configured by a cassette elevator 118a, which is capable of ascending and descending with holding the cassette 110, and a cassette carrying mechanism 118b as a carrying mechanism. The cassette carrying apparatus 118 is configured so as to carry the cassette 110 among the cassette stage 114, the cassette shelf 105 and the preliminary cassette shelf 107, by continuous motion of the cassette elevator 118a and the cassette carrying mechanism 118b.

At the backward of the cassette shelf 105, a wafer transfer mechanism 125 is installed. The wafer transfer mechanism 125 is configured by a wafer transfer apparatus 125a, which is capable of rotating or directly acting the wafer 200 in a horizontal direction, and a wafer transfer apparatus elevator 125b for ascending and descending the wafer transfer apparatus 125a. At the wafer transfer apparatus 125a, tweezers 125c for picking up the wafer 200 is installed. The wafer transfer mechanism 125 is configured so as to charge the wafer 200 to a boat 217, or exclude from the boat 217, so that the tweezers 125c acts as a mounting part of the wafer 200, by continuous motion of the wafer transfer apparatus 125a and the wafer transfer apparatus elevator 125b.

At the upward of the back part of the housing 111, a processing furnace 202 for heat processing the wafer 200 is installed, and it is configured so that the lower end part of the processing furnace 202 is opened and closed by a throat shutter 147.

At the downward of the processing furnace 202, there is installed a boat elevator 115 for ascending and descending a boat 217 to the processing furnace 202. An arm 128 is jointed to an ascending and descending step of the boat elevator 115, and at the arm 128, a seal cap 210 is installed horizontally. The seal cap 219 supports the boat 217 vertically and is also configured so as to be capable of blocking the lower end part of the processing furnace 202.

The boat 217 is provided with a plurality of holding members, and is configured so that each of multiple pieces (for example, about 50 to 150 pieces) of the wafers 200 is hold horizontally in an ordered state aligned in a vertical direction by lining-up the center thereof.

At the upward of the cassette shelf 105, there is installed a clean unit 134a for supplying clean air, which is purified atmosphere. The clean unit 134a is configured by a supply fan and a dust-proof filter, so as to flow clean air through inside of the housing 111.

At the left side end part of the housing 111, a clean unit 134b for supplying clean air is installed. The clean unit 134b is also configured by the supply fan and the dust-proof filter, so as to flow clean air through the vicinity of the wafer transfer apparatus 125a or the boat 217 or the like. The said clean air is designed to be exhausted outside of the housing 111, after flowing the vicinity of the wafer transfer apparatus 125a or the boat 217 or the like.

Subsequently, explanation will be given on main motion of the substrate processing apparatus 101.

When the cassette 110 is carried in onto the cassette stage 114 by the yard carrying apparatus (not shown), the cassette 110 is mounted so that the cassette 200 holds a vertical position on the cassette stage 114, and the wafer gateway of the cassette 110 faces an upper direction. Then, the cassette 110 is rotated clock-wise in a longitudinal direction by 90 degree to the backward of the housing 111 by the cassette stage 114, so that the wafer 200 in the cassette 110 takes a horizontal position, and the wafer gateway of the cassette 110 faces backward of the housing 111.

Then, the cassette 110 is automatically carried and transferred at a specified shelf position of the cassette shelf 105 or the preliminary cassette shelf 107, by the cassette carrying apparatus 118, and is stored temporarily, and then transferred at a transfer shelf 123 from the cassette shelf 105 or the preliminary cassette shelf 107, by the cassette carrying apparatus 118, or carried directly to the transfer shelf 123.

When the cassette 110 is transferred at the transfer shelf 123, the wafer 200 is picked-up from the cassette 110 by the tweezers 125c of the wafer transfer apparatus 125a, through the wafer gateway, and charged into the boat 217. The wafer transfer apparatus 125a, after transferring the wafer 200 to the boat 217, returns to the cassette 110 to charge the subsequent wafer 110 into the boat 217.

When previously specified pieces of wafers 200 are charged into the boat 217, the throat shutter, which had closed the lower end part of the processing furnace 202, opens to release the lower end part of the processing furnace 202. Subsequently, the boat 217 held the wafer 200 group is loaded inside the processing furnace 202, by ascending motion of the boat elevator 115, and the lower part of the processing furnace 202 is blocked by the seal cap 219.

After the loading, arbitrary heat processing is executed to the wafer 200 in the processing furnace 202. After this heat processing, the wafer 200 and the cassette 110 are carried out outside of the housing 111, by the reversed procedure of the above.

Figure 2:
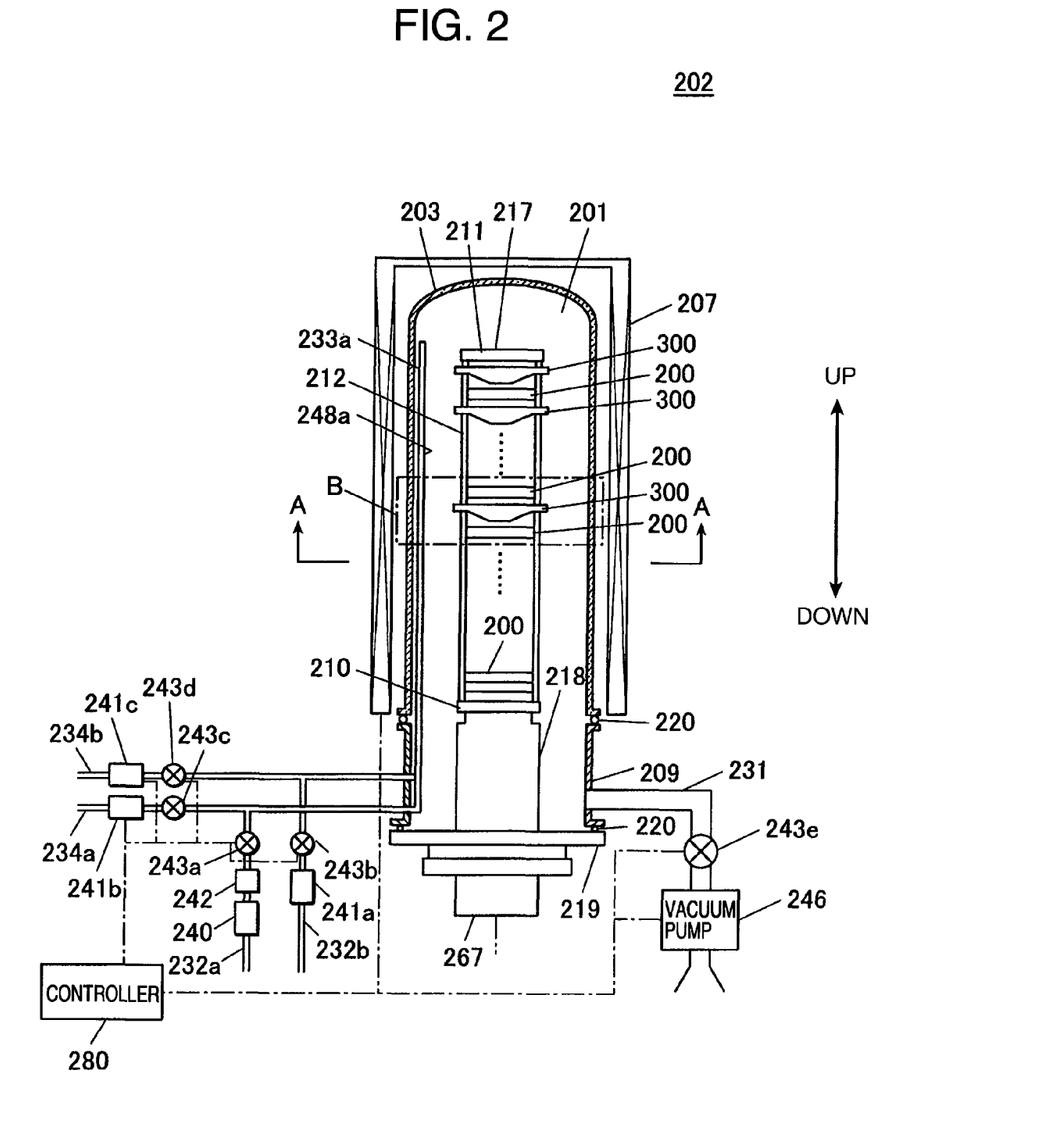
FIG. 2 is a schematic configuration drawing of a vertical-type processing furnace used in the embodiment of the present invention, and a member associated therewith, and in particular, shows the processing furnace part by a longitudinal section.
Figure 3:
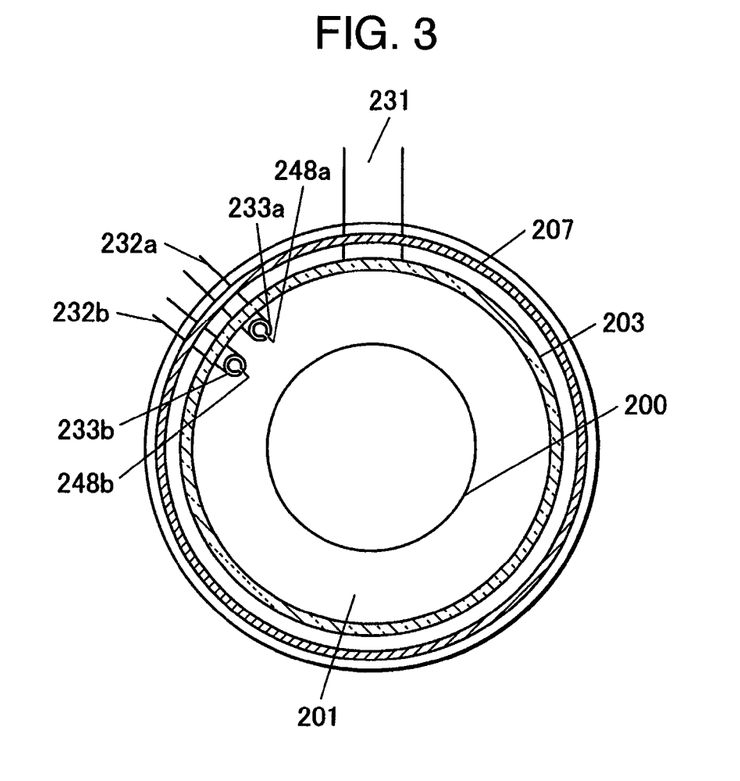
FIG. 3 is a cross-sectional view along the A-A line of FIG. 2.

As shown in FIGS. 2 and 3, in the processing furnace 202, a heater 207 functioning as a heating means is installed. At the inside of the heater 207, a reaction tube 203 for processing the wafer 200, which becomes an example of a substrate, is installed. At the lower end of the reaction tube 203, a manifold 209 configured by stainless steel or the like is installed via an O-ring 220, which is an air-tight member. The lower end opening of the manifold 209 is air-tightly blocked by the seal cap 219 as the housing, via the O-ring 220. In the processing furnace 202, a processing chamber 201 is formed by at least the reaction tube 203, the manifold 209 and the seal cap 219.

In the seal cap 219, a boat supporting stand 218 for supporting the boat 217 is installed, which boat is capable of holding multiple pieces of the wafers 200. The boat 217 has a bottom plate 210 fixed at the boat supporting stand 218, and a top board 211 arranged at the upward thereof, and has a configuration that a plurality of support rods 212 are installed between the bottom plate 210 and the top board 211. Between the bottom plate 210 and the top board 211, multiple pieces of the wafers 200 and an adjustment plate 300 are laminated in an alternating way, with a constant interval while holding a horizontal position.

Figure 6:
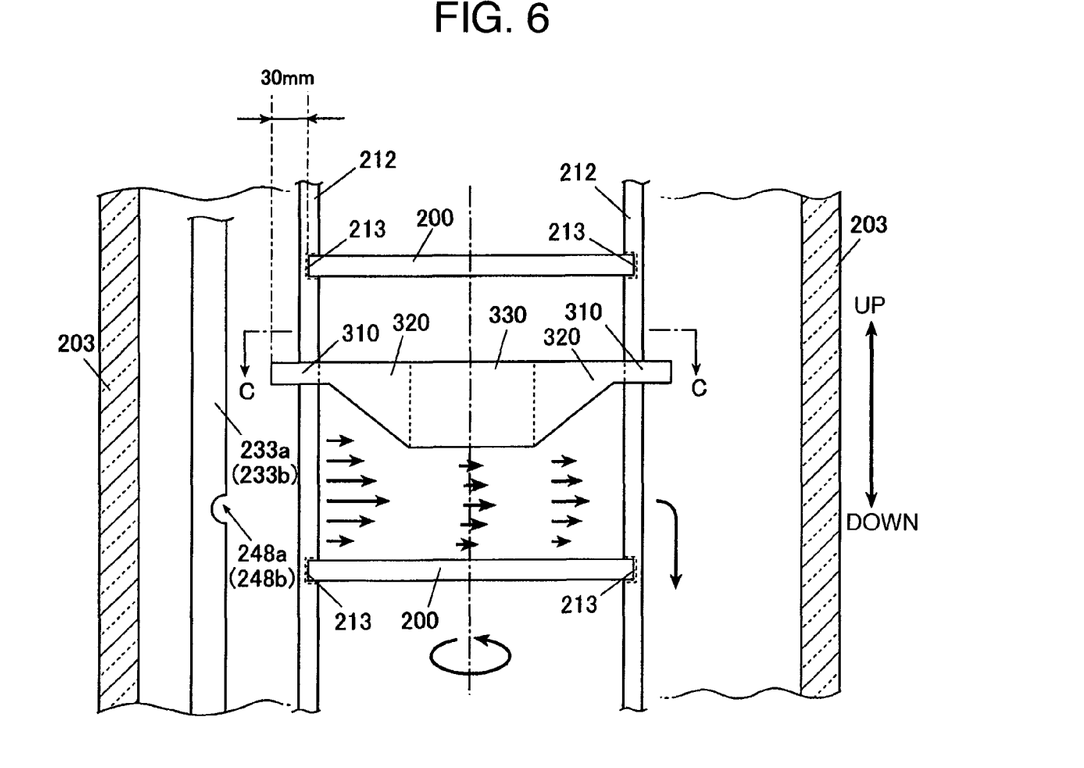
FIG. 6 is a magnified view of a B part of FIG. 2.

As shown in FIG. 6, at the support rods 212, a notch 213, with a degree of enabling to insert the wafer 200, is formed, and the wafer 200 is inserted to the notch 213 and held by the boat 217.

The adjustment plate 300 is fixed to the support rods 212. The adjustment plate 300 is supported slidably along the support rods 212, and still more is designed so that height position thereof can be changed.

It should be noted that, such a configuration may also be adopted that multiple pieces of pins are installed to the adjustment plate 300, and the wafer 200 arranged upward thereof is supported by the said pins.

In the present Embodiment 1, one piece of the adjustment plate 300 is installed per one piece of the wafer 200, and the adjustment plate 300 is arranged at a position facing the surface (surface to be processed) of the wafer 200, and at the upward position of the wafer 200.

Figure 8:
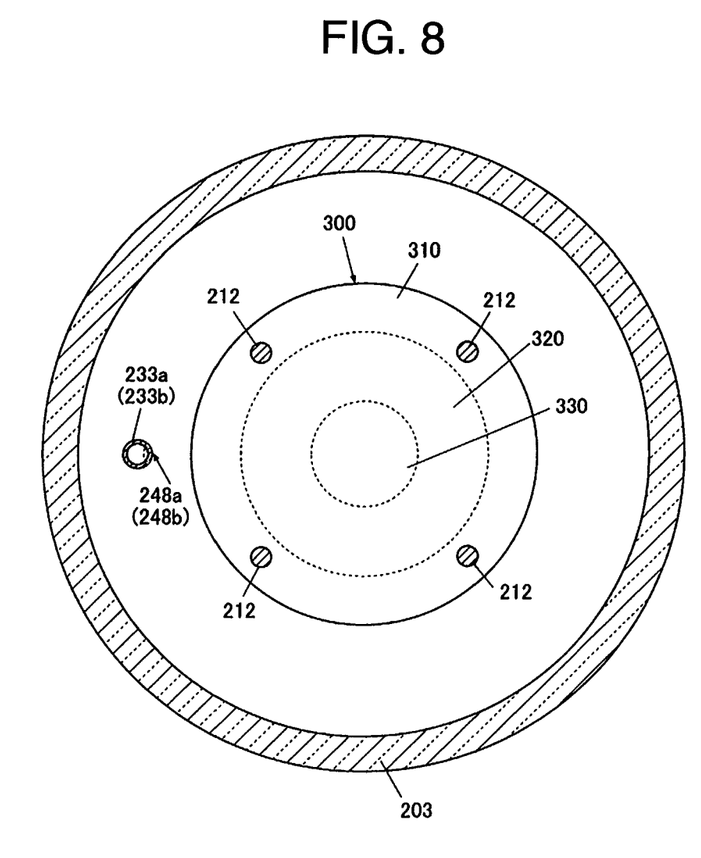
FIG. 8 is a cross-sectional view along the C-C line of FIG. 6.

As shown in FIGS. 6 and 8, the adjustment plate 300 is a plate-like member having a circular shape, and mainly configured by three sites, that is, the circumference part 310, the midway part 320, and the center part 330. Each of the upper surfaces of the circumference part 310, the midway part 320, and the center part 330 is present at the same plane, and the adjustment plate 300 has a flat upper surface.

The circumference part 310 is a ring-like site having constant thickness, and is fixed slidably to the support rods 212, in a state penetrating the support rods 212. The circumference part 310 is protruded from the circumference part of the wafer 200 toward outer side (toward the inner wall of the reaction tube 203), and diameter of the adjustment plate 300 is designed to be larger than diameter of the wafer 200 by 30 mm at a maximum. The midway part 320 is a ring-like site having thickness increasing proportionally from the circumference part 310 toward the center part 330. The center part 330 is a circular-cylinder-like site having constant thickness, and is the thickest one among each sites of the adjustment plate 300.

In the adjustment plate 300 and the wafer 200 arranged downward thereof, distance between the center part 330 and the surface of the wafer 200 is narrower than distance between the circumference part 310 or the midway par 320 and the surface of the wafer 200. In more detail, distance between the midway par 320 and the surface of the wafer 200 gradually narrows from the circumference part 310 toward the center part 330, and distance between the center part 330 and the surface of the wafer 200 is narrowest.

In the foregoing processing furnace 202, in a state that multiple pieces of the wafers 200 to be processed in batch-wise are laminated in multi-stages to the boat 217, the boat 217 is inserted into the processing chamber 201 with being held by the boat supporting stand 218, and the heater 207 heats the wafer 200 inserted into the processing chamber 201 to predetermined temperature.

It should be noted that, in the present Embodiment 1, the adjustment plate 300 may be any member, as long as distance between the center part 330 and the surface of the wafer 200 is narrow than distance between a part other than the center part 330 (the circumference part 310, the midway part 320 or the like) and the surface of the wafer 200, for example, may be a plate-like member having constant thickness, and a member showing a convex shape from the upward to the downward, by bending or curving from the circumference part 310 over the center part 330.

As shown in FIG. 2, to the processing chamber 201, two gas supply pipes 232a and 232b are connected, as supply routes for supplying multiple kinds (two kinds in the present Embodiment 1) of the processing gas.

In the gas supply pipes 232a, a mass-flow controller 240 for liquid, a vaporizer 242 and a valve 243a are installed in this order from the upstream side (end part).

In the tip part of the gas supply pipe 232a, a nozzle 233a is connected. The nozzle 233a extends in up and down direction along the inner wall of the reaction tube 203, in arc-like space between the inner wall of the reaction tube 203, configuring the processing chamber 201, and the wafer 200. In the side surface of the nozzle 233a, many gas supply holes 248a for supplying processing gas are installed.

The gas supply holes 248a have each the same opening space from the lower part over the upper part, and still more are provided in the same opening pitch. In particular, the gas supply holes 248a are arranged, as shown in FIG. 6, at the height position corresponding to the space part between the adjustment plate 300 and the wafer 200 downward thereof, and have an opening toward the space part.

Still more, to the gas supply pipe 232a, a carrier gas supply pipe 234a for supplying carrier gas is connected. In the carrier gas supply pipe 234a, a mass-flow controller 241b and a valve 243c are installed in this order from the upstream direction.

On the other hand, in the gas supply pipe 234b, a mass-flow controller 241a and a valve 243b are installed in this order from the upstream direction.

Also in the tip part of the gas supply pipe 232b, a nozzle 233b is connected. The nozzle 233b also extends, similarly as the nozzle 233a, in up and down direction along the inner wall of the reaction tube 203, in arc-like space between the inner wall of the reaction tube 203, which configures the processing chamber 201, and the wafer 200. In the side surface of the nozzle 233b, many gas supply holes 248b for supplying processing gas are installed.

Also, the gas supply holes 248b, similarly as the gas supply holes 248a, have each the same opening space from the lower part over the upper part, and still more are provided with the same opening pitch. The gas supply holes 248b also are arranged, as shown in FIG. 6, at the height position corresponding to the space part between the adjustment plate 300 and the wafer 200 downward thereof, and have an opening toward the said space part.

Still more, to the gas supply pipe 232b, a carrier gas supply pipe 234b for supplying carrier gas is connected. In the carrier gas supply pipe 234b, a mass-flow controller 241c and a valve 243d are installed in this order from the upstream direction.

As an example relevant to the foregoing configuration, a liquid raw material, as processing gas, is designed to be introduced into the gas supply pipe 232a, and when the liquid raw material is flowed into the gas supply pipe 232a, in a state that the valve 243a is open, the liquid raw material is designed to reach a vaporizer 242 under control of flow amount by the mass-flow controller 240 for liquid, to be vaporized by the vaporizer 242, and the vaporized gas is supplied inside the processing chamber 201, via a nozzle 233a.

On the other hand, a gas raw material is designed to be introduced into the gas supply pipe 232b as processing gas, and when the gas raw material is flowed into the gas supply pipe 232b in a state that the valve 243b is open, the said gas raw material is designed to flow the gas supply pipe 232b under being adjusted the flow amount by the mass-flow controller 241a, and finally supplied to the processing chamber 201 via a nozzle 233b.

To the processing chamber 201, a gas exhaust pipe 231 for exhausting gas is connected via a valve 243e. To the gas exhaust pipe 231, a vacuum pump 246 is connected, and it is designed that inside of the processing chamber 201 can be evacuated by actuation of the vacuum pump 246. The valve 243e is an open and close valve, which can start and stop the vacuum exhausting of the processing chamber 201 by switching action, as well as can adjust opening degree of the valve, and also can adjust inside pressure of the processing chamber 201.

At the center part in the reaction tube 203, a boat 217 is installed. The boat 217 is designed to be capable of ascending and descending (come in and out) to the reaction tube 203, by a boat elevator mechanism (not shown). At the lower end part of the boat supporting stand 218 supporting the boat 217, a boat rotation mechanism 267 for rotating the boat 217, to enhance processing uniformity, is installed. By driving the boat rotation mechanism 267, it is designed so that the boat 217 supported by the boar support stand 218 can be rotated.

Each member such as the foregoing mass-flow controller 240 for liquid, the mass-flow controllers 241a, 241b and 241c, the valves 243a, 243b, 243c, 243d and 243e, the heater 207, the vacuum pump 246, the boat rotation mechanism 267, the boat elevator mechanism is connected to a controller 280, which is a control part.

The controller 280 is designed to control flow amount adjustment of the liquid mass-flow controller 240, flow amount adjustment of the mass-flow controllers 241a, 241b and 241c, switching action of the valves 243a, 243b, 243c and 243d, switching action and pressure adjustment action of the valve 243e, temperature adjustment of the heater 207, start and stop of the vacuum pump 246, rotation speed adjustment of the boat rotation mechanism 267, ascending and descending action of the boat elevator mechanism and the like.

In the foregoing explanation on the embodiment of a substrate processing apparatus, a normal-flow type substrate processing apparatus was described in detail, where the nozzles 233a and 233b of the gas supply pipes 232a and 232b were arranged in a lamination direction of the wafer 200, and the gas exhaust pipe 231 was installed at the lower end part of the processing chamber 201, however, the same application is possible also to a side-flow type substrate processing apparatus, where an exhaust port 704 is installed at a position facing a gas supply port 700, with sandwiching the wafer, as disclosed in patent application 2007-165388, or schematically exemplified in FIG. 4.

Then, explanation will be given on an example of film-formation processing used an ALD method, based on an example of formation of an $HfO_2$ film used TEMAH and $O_3$, which is one manufacturing step for a semiconductor apparatus (a semiconductor device).

The ALD (Atomic Layer Deposition) method, which is one method of CVD (Chemical Vapor Deposition), is a method for execution of film-formation under certain film-formation conditions (temperature, tine and the like), by supplying processing gas, which will be at least two kinds of raw materials used in film-formation, onto a substrate one kind by one kind in a alternating way, subjecting to adsorption onto the substrate in one atom unit, and by utilization of a surface reaction. In this time, control of film thickness is executed by cycle number for supplying processing gas (for example, when film-formation rate is 1 Å/cycle, and a film with a thickness of 20 Å is formed, 20 cycles are executed).

In the ALD method, for example, in the case of forming an $HfO_2$ film, high-quality film-formation is possible by using TEMAH ($Hf(NCH_3C_2H_5)_4$: tetrakis(methylethylamino) hafnium) and $O_3$ (ozone), and at a low temperature of from 180 to 250° C.

At the beginning, as foregoing, the wafer 200 is charged into the boat 217, the boat 217 is carried into the processing chamber 201 and rotated by the boat drive mechanism 267, and the wafer 200 is rotated, then the following 4 steps to be described below are executed sequentially (in an example below, $N_2$, which is a kind of inert gas, is used as carrier gas).
(Step 1)

In a state that the vacuum pump 246 is operated, TEMAH is flowed into the gas supply pipe 232a, and carrier gas is flowed into each of the carrier gas supply pipe 234a and the carrier gas supply pipe 234b. In this state, the valve 243a of the gas supply pipe 232a, the valve 243c of the carrier gas supply pipe 234a, the valve 243d of the carrier gas supply pipe 234b, and the valve 243e of the gas exhaust pipe 231 are opened.

The carrier gas flowed-in from the carrier gas supply pipe 234a flows the carrier gas supply pipe 234a with being adjusted the flow amount by the mass-flow controller 241b, and reaches a junction part of the gas supply pipe 232a and the carrier gas supply pipe 234a.

Liquid TEMAH flowed-in from the gas supply pipe 232a is vaporized at a vaporizing part 240 with being adjusted the flow amount by the mass-flow controller 240, and reaches a junction part of the gas supply pipe 232a and the carrier gas supply pipe 234a.

After that, vaporized gas of TEMAH flow together with carrier gas and is supplied to the processing chamber 201 from a nozzle 233a in a mixed state with the carrier gas.

In detail, as shown in FIG. 6, when vaporized gas of TEMAH is flowed out (injected) from a gas supply hole 248a of the nozzle 233a, vaporized gas of TEMAH passes on the surface of the wafer 200 while flowing in a direction nearly parallel to the surface of the wafer 200, in the space part between the adjustment plate 300 and the wafer 200 downward thereof.

In this case, vaporized gas of TEMAH flows with diffusing, in the said space part, at a position corresponding to the circumference part 310 facing the nozzle 233a, and flows with gradually converging at a position from the midway part 320 over the center part 330, and is exhausted from the gas exhaust pipe 231. In addition, vaporized gas of TEMAH flows with diffusing at the center part 330, and at least a part of the diffused vaporized gas of TEMAH flows the midway part 320, and is finally exhausted from the gas exhaust pipe 231.

On the other hand, the carrier gas flowed-in from the carrier gas supply pipe 234b flows the carrier gas supply pipe 234b and the gas supply pipe 232b with being adjusted the flow amount by the mass-flow controller 241c, and is supplied to the processing chamber 201 via the nozzle 233b, and finally exhausted from the gas exhaust pipe 231.

In this time, in the step 1, pressure inside the processing chamber 201 is maintained under optimal value within a certain range by suitable adjustment of the valve 243e. Supply amount of TEMAH controlled by the liquid mass-flow controller 240 is from 0.01 to 0.1 g/min. Exposure time of the wafer 200 to vaporized gas of TEMAH is from 30 to 180 seconds. In this time, temperature of the heater 207 is set so that temperature of the wafer 200 becomes optimal value within a range of from 180 to 250° C.

In the foregoing step 1, by supplying vaporized gas of TEMAH, as processing gas, inside the processing chamber 201 as described above, TEMAH is subjected to a surface reaction (chemical adsorption) with the surface part of an underground film or the like on the wafer 200.

(Step 2)

Supply of vaporized gas of TEMAH is stopped by closing the valve 243a of the gas supply pipe 232a, and also supply of carrier gas is stopped by closing the valve 243c of the carrier gas supply pipe 234a, and the valve 243d of the carrier gas supply pipe 234b.

In this time, the valve 243e of the gas exhaust pipe 231 is maintained open, and the inside of the processing chamber 201 is exhausted to become equal to or lower than 20 Pa by the vacuum pump 246, and vaporized gas of TEMAH remained in the processing chamber 201 or the like is excluded from inside the processing chamber 201.

It should be noted that, in the step 2, supply of carrier gas to the processing chamber 201 may be continued by maintaining both or either of the valve 243c of the carrier gas supply pipe 234a, and the valve 243d of the carrier gas supply pipe 234b, in an open state, and in this case, effect of excluding the vaporized gas of TEMAH remained in the processing chamber 201 or the like from the processing chamber 201 is still more enhanced.

(Step 3)

$O_3$ is flowed-in to the gas supply pipe 232b, and carrier gas is flowed-in to each of the carrier gas supply pipe 234a and the carrier gas supply pipe 234b. In this state, the valve 243b of the gas supply pipe 232b, the valve 243d of the carrier gas supply pipe 234b, and the valve 243c of the carrier gas supply pipe 234a are opened.

The carrier gas flowed-in from the carrier gas supply pipe 234b flows the carrier gas supply pipe 234b with being adjusted the flow amount by the mass-flow controller 241c, and reaches a junction part of the gas supply pipe 232b and the carrier gas supply pipe 234b.

$O_3$ flowed-in from the gas supply pipe 232b flows the gas supply pipe 232b with being adjusted the flow amount by the mass-flow controller 241a, and reaches a junction part of the gas supply pipe 232b and the carrier gas supply pipe 234b.

After that, $O_3$ flows together with carrier gas and is supplied to the processing chamber 201 from a nozzle 233b in a mixed state with the carrier gas.

In detail, similarly as in flow of vaporized gas of TEMAH in the step 1, when $O_3$ is flowed out (injected) from a gas supply hole 248b of the nozzle 233b, $O_3$ passes on the surface of the wafer 200 while flowing the space part between the adjustment plate 300 and the wafer 200 downward thereof, in a direction nearly parallel to the surface of the wafer 200.

In this case, $O_3$ flows with diffusing at a position corresponding to the circumference part 310 facing the nozzle 233b, in the said space part, and is exhausted from the gas exhaust pipe 231. In addition, $O_3$ flows with diffusing at the center part 330, and at least a part of the diffused $O_3$ flows the midway part 320, and is finally exhausted from the gas exhaust pipe 231.

On the other hand, the carrier gas flowed-in from the carrier gas supply pipe 234a flows the carrier gas supply pipe 234a and the gas supply pipe 232a with being adjusted the flow amount by the mass-flow controller 241b, and is supplied to the processing chamber 201 via the nozzle 233a, and finally is exhausted from the gas exhaust pipe 231.

In this time, in the step 3, the pressure in the processing chamber 201 is maintained under optimal value within a certain range by suitable adjustment of the valve 243e. Exposure time of the wafer 200 to $O_3$ is from 10 to 120 seconds. In this time, temperature of the heater 207 is set so that temperature of the wafer 200 becomes optimal temperature within a range of from 180 to 250° C., that is, the same temperature for supplying the vaporized gas of TEMAH in the step 1.

In the foregoing step 3, by supplying $O_3$, as processing gas, into the processing chamber 201, as described above, $O_3$ is subjected to a reaction with TEMAH chemically adsorbed on the surface of the wafer 200 to form an $HfO_2$ film on the wafer 200.

(Step 4)

After film-formation, supply of $O_3$ is stopped by closing the valve 243b of the gas supply pipe 232b, and also supply of carrier gas is stopped by closing the valve 243d of the carrier gas supply pipe 234b, and the valve 243c of the carrier gas supply pipe 234a. In this time, the valve 243e of the gas exhaust pipe 231 is kept open, and the inside of the processing chamber 201 is evacuated by the vacuum pump 246, and $O_3$ remained in the processing chamber 201 or the like, which is gas after contribution to film-formation, is excluded.

It should be noted that, in also the step 4, supply of carrier gas to the processing chamber 201 may be continued by maintaining both or either of the valve 243d of the carrier gas supply pipe 234b, and the valve 243c of the carrier gas supply pipe 234a, in an open state, and in this case, effect of excluding $O_3$ remained in the processing chamber 201 or the like, which is gas after contribution to film-formation, from the processing chamber 201 is still more enhanced.

Hereafter, by making the foregoing steps from 1 to 4 as one cycle, and by repeating this cycle in multiple times, an $HfO_2$ film having predetermined film thickness can be formed on the wafer 200.

It should be noted that, in the present Embodiment 1, explanation was given on a film-formation embodiment for forming an $HfO_2$ film by using TEMAH and $O_3$, however, by changing at least one of TEMAH and $O_3$ (by changing a kind of processing gas), other kind of films than an $HfO_2$ film can be formed.

According to the present Embodiment 1, because thickness of a position corresponding to the center part 330 is thicker than a position corresponding to the midway part 320, in up and down direction perpendicular to a supply direction of processing gas, and distance between the adjustment plate 300 and the surface of the wafer 200 narrows therewith, in the supply step of processing gas corresponding to the step 2 or the step 4, processing gas flowed out from the gas supply holes 248a and 248b flows with diffusing from a position corresponding to the midway part 320 over a position corresponding to the center part 330.

In the foregoing explanation on the present Embodiment 1, a normal-flow type substrate processing apparatus was described in detail, in the case of a normal-flow type substrate processing apparatus, gas not consumed in the upper part region of the processing chamber is excessively supplied to the lower part region, which may generate loading effect, because the nozzles 233a and 233b connected with the gas supply pipes 232a acid 232b are installed in the processing chamber 201, so as to extend in a lamination direction of multiple pieces of substrates, and the gas exhaust pipe 231 is installed at the lower part region of the processing chamber 201.

Therefore, it is effective to enhance the uniformity of thickness of a film formed on the surface of the wafer 200, by installment of the adjustment plate 300, exemplified in the foregoing Embodiment 1, only at the lower part region.

For example, in the case where diameter of the reaction tube 203 is from 380 to 440 mm and diameter of the wafer 200 is 300 mm, because of physical restriction that diameter of the adjustment plate 300 can be larger than diameter of the wafer 200 by up to 30 mm at a maximum, as space allowable amount enabling arrangement of the adjustment plate 300, diameter of the adjustment plate 300 is designed to be larger than diameter of the wafer 200 by 30 mm at the maximum.

Still more, for example, because there is chemical restriction that, in the case where a film is formed by subjecting the wafer 200 to heat processing such as oxidation treatment (see the present Embodiment 1) or nitriding treatment, film thickness varies in a region of about 10 mm inside from the circumference of the wafer 200, and in the case where a film is formed by using plasma to the wafer 200, film thickness varies in a region of about 30 mm inside from the circumference of the wafer 200, diameter of the adjustment plate 300 is designed to be larger than diameter of the wafer 200 by about 30 mm at a maximum.

It should be noted that when diameter of the adjustment plate 300 is over a value based on such physical restriction or chemical restriction, there is a possibility that carrying of the wafer 200 or thickness of a film formed on the wafer 200 becomes non-uniform.

Figure 7A:
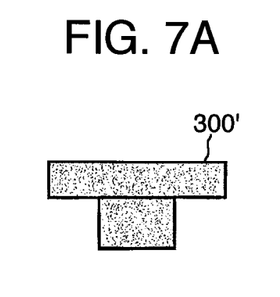
FIGS. 7A and 7B are drawings showing other embodiments of an adjustment plate.
Figure 7B:
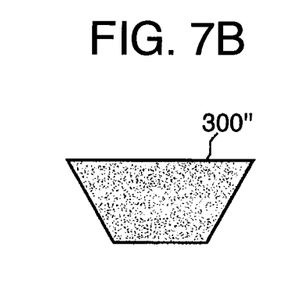

Here, as other shape of the adjustment plate 300, it is also effective to use an adjustment plate 300', as exemplified in FIG. 7A, which is formed with a predetermined circular cylinder-like protrusion on the lower surface of a disk-like base part with predetermined thickness, or an adjustment plate 300", as exemplified in FIG. 7B, with a circular truncated cone-like shape protruding toward the lower side.

Here, in the case where the adjustment plate 300 of the present Embodiment 1 is applied to a side-flow type processing chamber, by reducing gas flow-in amount to the center part of the wafer 200 by consumption of gas at the circumference part of the wafer 200 and by installment of a convex center part at the lower side of the adjustment plate 300, uniformity of thickness of a film formed on the wafer 300 can be enhanced.

It should be noted that, by adjusting, as appropriate, a position of the center part on the wafer 300, which position becomes convex at the lower side of the side-flow type processing chamber, it can be attained to prevent gas flow-in to the center part of the wafer 300, and to increase gas supply amount to the midway part of the wafer 300, so that the gas exited from the center part of the wafer 300 passes just through a part of the midway part of the wafer 300, where film thickness becomes thinnest.

Embodiment 2

Embodiment 2 is different mainly on the following points from Embodiment 1, and other points are nearly the same as in Embodiment 1.

Figure 9:
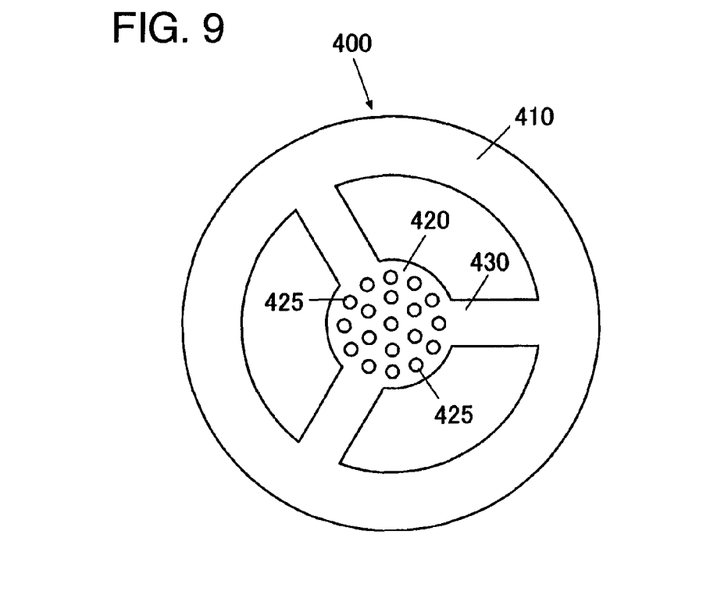
FIG. 9 is a plan view showing a schematic configuration of an adjustment plate relevant to one embodiment (Embodiment 2) of the present invention.

In the present Embodiment 2, an adjustment plate 400 of FIG. 9 is installed, instead of the adjustment plate 300 of Embodiment 1. The adjustment plate 400 is a flat-plate-like member with equal thickness, and is configured by a dielectric substance, which is capable of consuming processing gas. The adjustment plate 400 has mainly a circumference part 410 with nearly a ring shape, and a center part 420 with nearly a circle shape, and is so configured that a linear midway part 430 is installed crossing between the circumference part 410 and the center 420.

A site between the midway parts 430 themselves, which is a site between the circumference part 410 and the center 420, is hollow (a through hole from the front surface to the back surface of the paper surface). A plurality of through holes 425 are formed at the center part 420.

In the foregoing present Embodiment 2, surface area is different at each member of the circumference part 410, the midway part 430 and the center part 420, and consumption amount thereof is also designed to be different when processing gas flows. Therefore, by installment of the adjustment plate 400 instead of the adjustment plate 300, thickness of a film formed on the surface of the wafer 200 can be adjusted by each part on the surface of the wafer 200.

In addition, in the case where the adjustment plate 300, described in the foregoing present Embodiment 2, is used in a side-flow-type processing chamber, uniformity of film thickness can be enhanced by promoting gas consumption at the circumference part of the ring-type wafer 200 and the center part, which is a circular plate having through holes.

Embodiment 3

Embodiment 3 is different mainly on the following points from Embodiment 1, and other points are nearly the same as in Embodiment 1.

Figure 10:
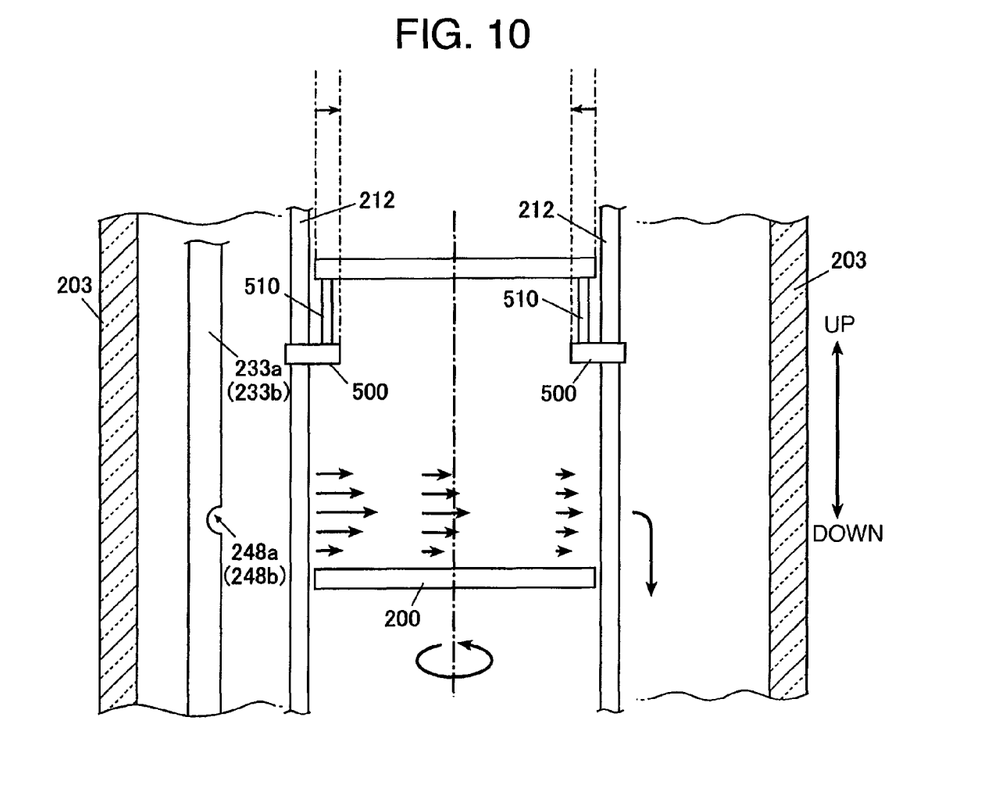
FIG. 10 is a drawing showing a schematic configuration of one embodiment (Embodiment 3) of the present invention.

In the present Embodiment 3, a ring 500 of FIG. 10 is installed, instead of the adjustment plate 300 of Embodiment 1. The ring 500 is a ring-like member with predetermined width (from about 10 to 30 mm), and is configured by a dielectric substance, which is capable of consuming processing gas, and fixed at the support rods 212. The ring 500 is designed to be slidably and free-detachment state to the support rods 212, and still more height position thereof can be changed.

In the ring 500, a plurality of pins 510 are installed, and the wafer 200 is supported by pins 510. Inner diameter of the ring 500 is designed to be smaller than diameter (outer diameter) of the wafer 200, and a part of the ring 500 and the circumference part of the wafer 200 are overlapped in an up and down direction.

In the foregoing present Embodiment 3, processing gas flowed out from the gas supply holes 248a and 248b is consumed by the ring 500, at a position corresponding to the circumference part of the wafer 200. Therefore, it can be suppressed that film thickness abruptly increases at the circumference part of the wafer 200, resulting in that thickness of a film formed on the surface of the wafer 200 can be made uniform over the said whole surface.

In the case of a normal-flow-type reaction funnel having a multihole nozzle and one exhaust port at the lower part region of a processing chamber, gas not consumed in the upper part region of the processing chamber is excessively supplied to the lower part region, which may generate loading effect, however, in such a case, enhancement of uniformity of the inside surface can be attained also, by installment of the adjustment plate 300, exemplified in the foregoing Embodiments 2 and 3, only at the lower part region, so as to promote gas consumption.

Even in any of the cases of Embodiments 1, 2 and 3 exemplified heretofore, shape and detachment of the adjustment plate 300 are changed in response to process conditions such as gas type, gas supply amount. It should be noted that, as a material of the adjustment plate 300, a dielectric substance can be used in Embodiment 1, and other materials can be applied also, as long as having a shape to release gas at the center part thereof. In addition, in the case of Embodiments 2 and 3, it is an essential requisite for the adjustment plate 300 to be a dielectric substance.

Here, as Comparative Example of the present Embodiment 3, it can be envisaged the case not having the ring 500, and the case where inner diameter of the ring 500 is the same as diameter of the wafer 200. In these cases, when an oxidized film was formed on the surface of the wafer 200 by using plasma, schematic relation between position of the wafer 200 (diameter of 300 mm) and thickness of the oxidized film is as shown in FIG. 9.

Figure 11:
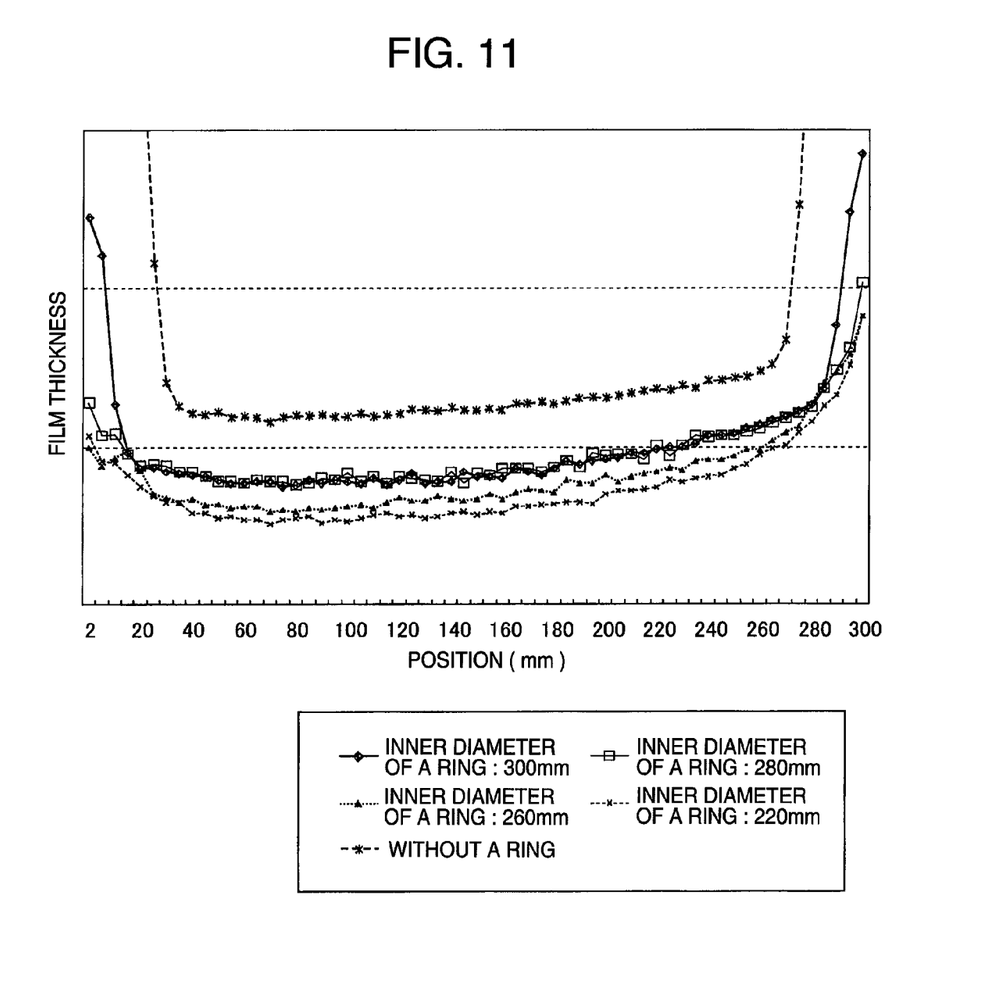
FIG. 11 is a drawing showing schematic relation between a position in a substrate and thickness of a film formed on the surface to be processed of substrate, in one embodiment (Embodiment 3) and Comparative Embodiment thereof of the present invention.

As shown in FIG. 11, in the case where the ring 500 is not present (see a curve "without a ring"), film thickness abruptly increases at a region about 30 mm inside from the circumference of the ring 500. In the case where inner diameter of the ring 500 is the same as diameter of the wafer 200 (see a curve "inner diameter of a ring: 300 mm"), film thickness abruptly increases at a region about 20 mm inside from the circumference of the ring 500.

On the other hand, in the case where inner diameter of the ring 500 is smaller than diameter of the wafer 200 (see curves "inner diameter of a ring: 280 mm, 260 mm, 220 mm"), film thickness abruptly increases, in particular, at a region about 20 mm inside from the circumference of the ring 500. Based on the foregoing results, even by installment of the ring 500 instead of the adjustment plate 300, thickness of a film formed on the surface of the wafer 200 can be made uniform.

Figure 12:
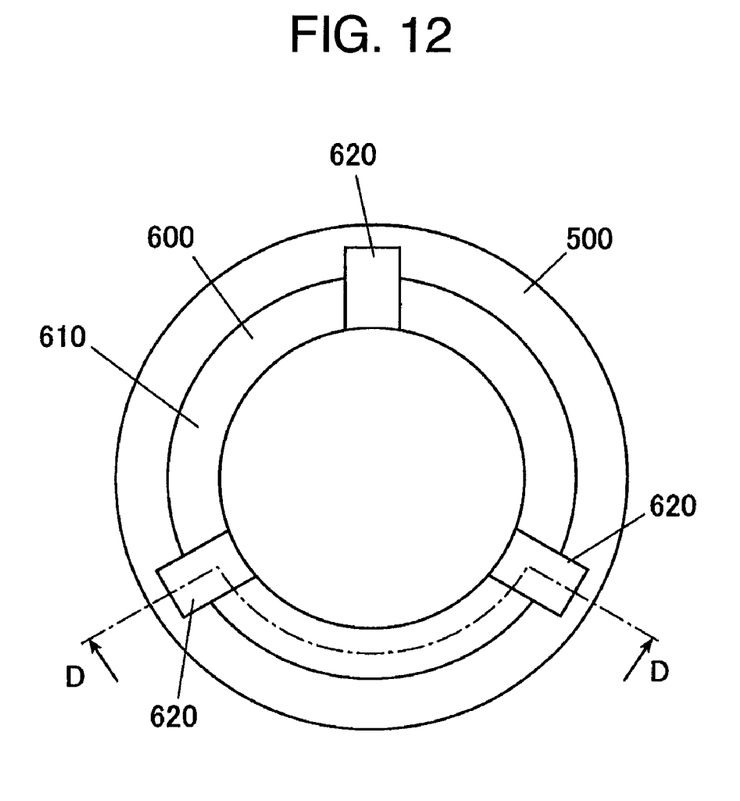
FIG. 12 is a plan view showing a schematic configuration of an adjustment ring relevant to one embodiment (Embodiment 3) of the present invention.
Figure 13:
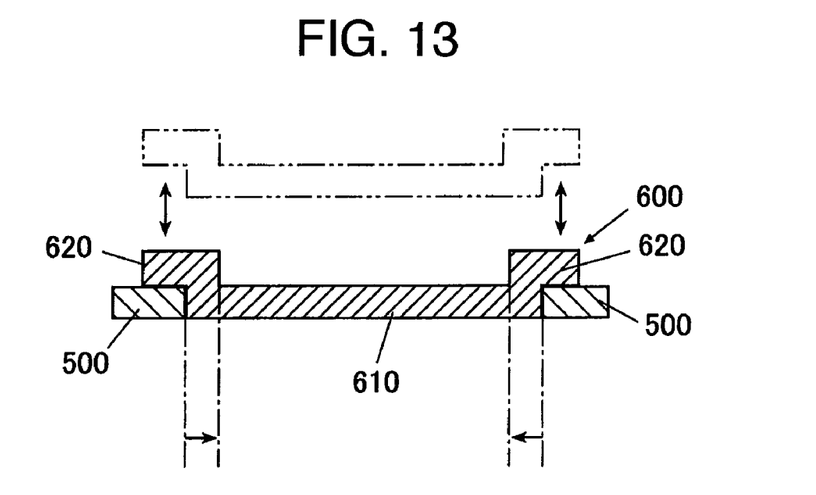
FIG. 13 is a cross-sectional view along the D-D line of FIG. 12.

It should be noted that, in the present Embodiment 3, an adjustment ring 600 of FIG. 12 and FIG. 13 may be installed instead of the ring 500. The adjustment ring 600 is a member configured by a dielectric substance, which is capable of consuming processing gas, mainly having a circular ring part 610 with a ring-shape, and a hook part 620 protruded radially from the circular ring part 610. The adjustment ring 600 is bent from the circular ring part 610 over a hook part 620, and a step is formed between the circular ring part 610 and the hook part 620. Outer diameter of the circular ring part 610 and inner diameter of the ring 500 are designed to nearly the same, and as shown in FIG. 13, the adjustment ring 600 is designed to engage to the ring 500, in free detachment.

In the foregoing configuration, by engaging the adjustment ring 600 to the inside of the ring 500, inner diameter of a member, which is capable of consuming processing gas, can be made equivalent to inner diameter of the adjustment ring 600. That is, in the case where inner diameter of the ring 500 is 280 mm, by engaging the adjustment ring 600 with a width of 10 mm to the inside of the ring 500, inner diameter of a member, which is capable of consuming processing gas, becomes equivalent to inner diameter of the adjustment ring 600.

In this case, in the case where inner diameter of the member, which is capable of consuming processing gas, is set to be 280 mm, by using the ring 500 alone, and in the case where inner diameter of the member, which is capable of consuming processing gas, is set to e 260 mm, by combining the ring 500 and the adjustment ring 600, thickness of a film formed on the wafer 200 can be simultaneously evaluated (in FIG. 9, a result of a curve of "inner diameter of a ring: 280 mm", and a result of a curve of "inner diameter of a ring: 260 mm" can be simultaneously acquired).

In addition, in the case where there is generated thickness variation of films formed in the wafers 200 themselves, or in trying to attain optimization of film-formation conditions, thickness of a film formed on the wafer 200 can be adjusted by populating the adjustment ring 600 to the ring 500, therefore, the adjustment ring 600 can be utilized as an effective tool to the ring 500.

As describe above, explanation was given on one embodiment of the present invention, and according to one embodiment of the present invention, there is provided a substrate processing apparatus having: a substrate hold means for holding a substrate, a processing chamber for accommodating the substrate and the substrate hold means, a supply means for supplying desired processing gas in a parallel direction to the surface to be processed of the substrate, a member to be arranged with facing the surface to be processed of the substrate to be accommodated in the processing chamber, and an exhaust means for exhausting atmosphere in the processing chamber, characterized in that a distance between the surface to be processed of the substrate to be accommodated in the processing chamber, and the center part of the member is narrower than a distance between the surface to be processed of the substrate to be accommodated in the processing chamber, and a part other than the center part of the member, in a direction perpendicular to a supplying direction of the processing gas.

In one Embodiment, the member has different thickness at the center part and a part other than the center part, and thickness at the center part is thicker than thickness at the part other than the center part.

It is preferable that the member has the same thickness at the center part and at the part other than the center part.

In other Embodiment, the substrates are present in multiple, and these multiple substrates are held in a constant interval, by the substrate hold means.

In addition, it is also possible that the substrate processing apparatus is still more provided with a rotation means for rotating the substrate hold means, to provide such a configuration that the rotation means is capable of rotating the substrate held by the substrate hold means.

It should be further understood by those skilled in the art that although the foregoing description has been made on embodiments of the invention, the invention is not limited thereto and various changes and modifications may be made without departing from the spirit of the invention and the scope of the appended claims.

The invention claimed is:

1. A substrate processing apparatus comprising;
a substrate hold unit for holding a substrate;
a processing chamber for accommodating said substrate and said substrate hold unit;
a supply unit for supplying desired processing gas in a parallel direction to the surface to be processed of said substrate;
a member to be arranged with facing the surface to be processed of said substrate to be accommodated in said processing chamber; and
an exhaust unit for exhausting atmosphere in said processing chamber,
wherein a distance between the surface to be processed of said substrate to be accommodated in said processing chamber, and the center part of said member is narrower than a distance between the surface to be processed of said substrate to be accommodated in said processing chamber, and a part other than the center part of said member, in a direction perpendicular to a supplying direction of said processing gas, and
wherein pins for supporting the substrate are installed on the upper surface of said member.

2. A substrate processing apparatus comprising;
a substrate hold unit for holding a substrate;
a processing chamber for accommodating said substrate and said substrate hold unit;
a supply unit for supplying desired processing gas in a parallel direction to the surface to be processed of said substrate;
a member to be arranged with facing the surface to be processed of said substrate to be accommodated in said processing chamber; and
an exhaust unit for exhausting atmosphere in said processing chamber,
wherein a distance between the surface to be processed of said substrate to be accommodated in said processing chamber, and the center part of said member is narrower than a distance between the surface to be processed of said substrate to be accommodated in said processing chamber, and a part other than the center part of said member, in a direction perpendicular to a supplying direction of said processing gas , and
wherein said member is configured slidably along a longitudinal direction of said processing chamber.

3. The substrate processing apparatus according to claim 2 wherein said member is configured by a dielectric substance.

4. A substrate processing apparatus comprising;
a substrate hold unit for holding a substrate;
a processing chamber for accommodating said substrate and said substrate hold unit;
a supply unit for supplying desired processing gas in a parallel direction to the surface to be processed of said substrate;
a member to be arranged with facing the surface to be processed of said substrate to be accommodated in said processing chamber; and
an exhaust unit for exhausting atmosphere in said processing chamber,
wherein a distance between the surface to be processed of said substrate to be accommodated in said processing chamber, and the center part of said member is narrower than a distance between the surface to be processed of said substrate to be accommodated in said processing chamber, and a part other than the center part of said member, in a direction perpendicular to a supplying direction of said processing gas , and
wherein said processing chamber comprises:
an outer tube, and
an inner tube which is installed inside said outer tube, and at least the lower end side is opened, where a plurality of substrates are held and accommodated by the substrate hold unit,
wherein said gas supply unit has a gas nozzle, which has a plurality of gas supply holes, installed inside said inner tube, so as to extend in a lamination direction of said multiple pieces of substrates,
wherein said processing chamber further comprises:
a plurality of exhaust ports installed at said inner tube, at a position facing said gas nozzle, with sandwiching said substrate, and
wherein one sheet of said member per one sheet of the substrate is installed facing the surface to be processed of said substrate.

* * * * *